United States Patent
Schmidhammer

(10) Patent No.: US 8,076,999 B2
(45) Date of Patent: Dec. 13, 2011

(54) ELECTROACOUSTIC RESONATOR, FILTER, DUPLEXER AND METHOD FOR DETERMINING PARAMETERS OF A RESONATOR

(75) Inventor: Edgar Schmidhammer, Stein (DE)

(73) Assignee: Epcos AG, Munich (DE)

( * ) Notice: Subject to any disclaimer, the term of this patent is extended or adjusted under 35 U.S.C. 154(b) by 674 days.

(21) Appl. No.: 11/917,417

(22) PCT Filed: May 31, 2006

(86) PCT No.: PCT/EP2006/005192
§ 371 (c)(1),
(2), (4) Date: May 23, 2008

(87) PCT Pub. No.: WO2006/133807
PCT Pub. Date: Dec. 21, 2006

(65) Prior Publication Data
US 2009/0309677 A1 Dec. 17, 2009

(30) Foreign Application Priority Data
Jun. 15, 2005 (DE) .................. 10 2005 027 715

(51) Int. Cl.
H03H 9/15 (2006.01)
H03H 9/72 (2006.01)
(52) U.S. Cl. .................. 333/187; 333/193
(58) Field of Classification Search ............ 333/187, 333/193
See application file for complete search history.

(56) References Cited

U.S. PATENT DOCUMENTS

| | | | |
|---|---|---|---|
| 4,719,383 A | 1/1988 | Wang et al. | |
| 5,714,917 A | 2/1998 | Ella | |
| 6,741,146 B2 * | 5/2004 | Ella | 333/133 |
| 7,057,478 B2 * | 6/2006 | Korden et al. | 333/189 |
| 7,262,676 B2 * | 8/2007 | Ruile et al. | 333/193 |
| 7,595,693 B2 * | 9/2009 | Wiklund | 330/282 |
| 2002/0123319 A1 * | 9/2002 | Peterzell | 455/296 |
| 2009/0002102 A1 * | 1/2009 | Tsuzuki et al. | 333/204 |

FOREIGN PATENT DOCUMENTS
EP 0 963 040 11/2006
JP 59148421 8/1984

OTHER PUBLICATIONS

Jummel, G., "Symbolisch Analyse und Optimierung nichtlinearer Verzerryngen in rueckgekoppelten Transistorschaltungen", ITG Fachbericht 162, ITG Workshop Nov. 20-21, 2000, Darmstadt, with English Abstract.
English Translation of the Written Opinion from corresponding PCT Application No. PCT/EP2006/005192, mailed Sep. 6, 2006, 6 pages.

(Continued)

*Primary Examiner* — Robert Pascal
*Assistant Examiner* — Alan Wong
(74) *Attorney, Agent, or Firm* — Fish & Richardson P.C.

(57) ABSTRACT

An electroacoustic resonator includes a resonator area for propagating an acoustic wave and a resonator surface area configured so that, when an input signal power of 0 dBm is applied at a resonant frequency $f_r$, power density in the resonator area does not exceed 40 dBm/m². An electroacoustic resonator includes a resonator surface area configured so that a critical input signal power $P_{IPn}$ at an $n^{th}$-order intercept point $IP_n$ is at least 80 dBm for n=2 and/or 80 dBm for n=3.

39 Claims, 5 Drawing Sheets

OTHER PUBLICATIONS

Jiang et al., "The Frequency Behavior of the Third-Order Intercept Point in a Waveguide Photodioe", IEEE Photonic Technology Letters, vol. 12, No. 5, May 2000, pp. 540-542.

Tay et al., "Performance Characterization of Thin ALN Films Deposited on MO Electrode for Thin-Film Bulk Acoustic-Wave Resonators", Japanese Journal of Applied Physics, vol. 43, No. 8A, Aug. 2004, pp. 5510-5515.

Search Report from corresponding PCT Application No. PCT/EP2006/005192, mailed Sep. 6, 2006, 4 pages.

* cited by examiner

ELECTROACOUSTIC RESONATOR, FILTER, DUPLEXER AND METHOD FOR DETERMINING PARAMETERS OF A RESONATOR

BACKGROUND

Resonators operating with bulk acoustic waves—BAW resonators (BAW=Bulk Acoustic Wave)—are known, for instance, from the publications EP 0963040 A2, U.S. Pat. No. 4,719,383 and U.S. Pat. No. 5,714,917. A BAW resonator comprises a piezoelectric layer, e.g., one made of ZnO, which is arranged between two electrodes. Such resonators are distinguished by a high power resistance.

SUMMARY

Described herein is an electroacoustic resonator that is suitable for use in multiband devices. Additionally, a method for determining parameters of an electroacoustic resonator capable of use in a multiband device is described.

It was found that resonators can have nonlinear transmission characteristics under certain circumstances. It is proposed to test properties of resonators with given parameters in, for instance, the developmental stage of a device comprising such resonators. In particular, resonators operating with acoustic waves, such as BAW resonators, will be tested in this regard.

Such a BAW resonator comprises a piezoelectric layer that is arranged between two electrodes. The BAW resonator can be arranged above an acoustic mirror formed on a carrier substrate or above a cutout provided in a carrier substrate.

It was determined by measurements that filters with conventional BAW resonators display nonlinear characteristics when a high signal power of, e.g., 10-35 dBm is applied, the nonlinearity of such filters increasing with increasing power. An excitation of a nonlinear system generally leads to the generation of harmonics at the output, even if a single-tone signal, i.e., an input signal with a single frequency, is applied. A nonlinearity additionally leads to interfering intermodulation products if signals with different frequencies are applied at the input. The intermodulation products can lie in the vicinity of the working band of the device to be investigated and thus, for example, interfere with the reception of the useful signal. The intermodulation noise and harmonic distortion of the signal can be prevented by using resonators with high linearity in a filter.

The nonlinearity of a BAW resonator derives from the fact, for instance, that the static capacitance of the resonator is dependent on the signal amplitude, i.e., the voltage applied to the resonator. This is connected to the fact that the deflection of the atoms in a piezoelectric material from their passive state, and consequently the thickness of the piezoelectric layer, depends on the applied voltage.

The static capacitance $C_0$ of a BAW resonator without an electrical signal is calculated from the formula for a plate capacitor:

$$C_0 = \varepsilon_0 \varepsilon_r \frac{A}{t}, \qquad (1)$$

where A is the surface area of the electrodes or the resonator surface area. t is the thickness of the piezoelectric layer without an electrical signal. $\epsilon_0$ is the dielectric constant of a vacuum, and $\epsilon_r$ is the relative dielectric constant of the piezoelectric layer.

The static capacitance C of a BAW resonator to which an electrical signal is applied is calculated as $$C = \varepsilon_0 \varepsilon_r \frac{A}{t + \Delta x} = C_0 \frac{1}{1 + \frac{\Delta x}{t}}, \qquad (2)$$

where $\Delta x$ is the changing thickness of the piezoelectric layer, which is proportional to the amplitude U of the electrical signal. The expression according to equation 2 can be developed in a series:

$$C \cong C_0 \left[ 1 - \left(\frac{\Delta x}{t}\right) + \left(\frac{\Delta x}{t}\right)^2 - \ldots \right].$$

Since $\Delta x = \propto U$, we have $$C(U) \cong C_0 [1 + a_1 U + a_2 U + \ldots],$$

where $a_1$, $a_2$ are coefficients that can be determined for a given piezoelectric material.

It was found that by adjusting certain parameters, e.g., geometric parameters, of a resonator, its linearity can be improved.

The linearity of a device, as a rule an active device, here a (passive) resonator, relates to its transmission characteristic curve. A transmission characteristic is understood to mean the dependence of the power level of an output signal on the power level of an input signal. The transmission characteristic is linear for a low input signal level. Above a certain input signal level, nonlinearities of the device become noticeable, so that the transmission characteristic deviates from a straight line in this range.

The dynamic range of the device is understood to mean the range of those input signal power levels that correspond to a linear section of the characteristic curve of the fundamental mode.

For the determination of a (linear) dynamic range of a device, characteristic curves of a fundamental mode and an nth-order spectral component generated in this device that deviates from the fundamental mode, e.g., an nth-order harmonic or an nth-order intermodulation product, are used, wherein, e.g., n=2 or n=3. The second-order harmonic corresponds to a second-order spectral component with twice the frequency of the fundamental mode, and is also referred to as a first harmonic. The third-order harmonic corresponds to a third-order spectral component with triple the frequency of the fundamental mode, and is also referred to as the second harmonic.

The transmission characteristic curves of the fundamental mode and an nth-order spectral component are both plotted in a diagram and the output signal power is plotted versus the input signal power. Linear sections of the characteristic curve of the fundamental mode and of the characteristic curve of the spectral component are linearly extrapolated to higher input signal levels, where their intersection point is determined. This intersection point is also called an intercept point=IP. An intercept point of the fundamental mode and an nth-order spectral component is referred to as an nth-order intercept point $IP_n$ ($IP_2$ for n=2 or $IP_3$ for n=3).

The power level of the input signal corresponding to the nth-order intercept point is referred to as a critical input signal power or an nth-order input intercept point $P_{IIPn}$, e.g., $P_{IIP2}$ for n=2 or $P_{IIP3}$ for n=3, is thus defined as the signal level at the input of a nonlinear system at which the output level determined by the intersection point of extrapolated characteristic curves of the fundamental mode and an nth-order spectral component generated in the device are identical. This output level is referred to as an nth-order output intercept point $P_{OIPn}$, e.g., $P_{OIP2}$ for n=2 (second-order output intercept point) or $P_{OIP3}$ for n=3 (third-order output intercept point).

A resonator operating with acoustic waves is specified whose resonator surface area is selected such that, in the transmission characteristic of the resonator, the critical input signal power, as a function of the order of the spectral component used for determining an intercept point, does not fall below a given target level.

In a variant, the target level is at least 80 dBm relative to the second-order input intercept point $P_{IIP2}$ and/or at least 50 dBm relative to the third-order input intercept point $P_{IIP3}$.

In another variant, the target level is at least 85 dBm for n=2 and/or at least 55 dBm for n=3.

In another variant, the target level is at least 90 dBm for n=2 and/or at least 60 dBm for n=3.

In another variant, the target level as at least 100 dBm for n=3 and/or at least 65 dBm for n=3.

In another variant, the target level is at least 115 dBm for n=3 and/or at least 67.5 DBm for n=3.

A resonator surface area is understood to mean the projection of an active resonator area, in which an acoustic wave is stimulated and is capable of being propagated, onto a lateral plane.

The specified resonator has a high linearity in a wide dynamic range and is suitable for use in a multiband device, particularly a mobile radio device. Due to a higher resonator surface area than in known resonators, the power density in the resonator is comparatively low.

Additionally, an electroacoustic resonator is specified with an active resonator area in which an acoustic wave is capable of being propagated. The resonator has a resonator surface area that is selected such that, when an input signal power of 0 dBm is applied at the resonant frequency $f_r$, the power density in the resonator area does not exceed a predetermined limit value of, e.g., 40 dBm/m². Depending on the design, the limit value can be 45, 50, 55, 60, 65, 70 or 75 dBm/m².

Although the specified resonator is a resonator operating with bulk acoustic waves in an embodiment, it is also possible to improve the linearity of resonators operating with surface acoustic waves or guided bulk acoustic waves—GBAW —by increasing the resonator surface area. An arbitrary combination of BAW, GBAW and SAW resonators may be implemented. FIG. 6 shows an SAW resonator; and FIG. 7 shows a GBAW resonator.

An nth-order output intercept point, e.g., $P_{OIP2}$ for n=2 or $P_{OIP3}$ for n=3, can be used to evaluate a resonator regarding its linearity with respect to the predetermined signal power level instead of an input intercept point $P_{IIP2}$ or $P_{IIP3}$.

The resonator surface area may be at least K/f, where $K=3.5\cdot10^4$ GHz·μm² and f is the resonant frequency of the resonator expressed in GHz. In another variant, $K=4\cdot10^4$; $4.5\cdot10^4$; $5\cdot10^4$; $5.5\cdot10^4$; $6\cdot10^4$; $6.5\cdot10^4$; $7\cdot10^4$; $7.5\cdot10^4$; $8\cdot10^4$; $9\cdot10^4$; $10^5$ GHz·μm².

The resonator can be arranged in the series branch, i.e., connected in series in a signal line connecting an input port and an output port. The resonator, however, can also be arranged in a shunt arm, e.g., between a signal line and ground, or between two signal lines.

The resonator, or several series resonators, with an improved linearity of the transmission characteristic may be used in a filter or a duplexer (see, e.g., FIG. 10). The filter or the duplexer in one variant can have an unbalanced input port and an unbalanced output port. The filter or the duplexer in another variant can have an unbalanced input port and a balanced output port. The filter or the duplexer in one variant can have a balanced input port and a balanced output port. An input port can be exchanged for an output port and vice versa.

The resonators can be connected in a ladder-type or a lattice-type arrangement (see, e.g., FIG. 8).

The resonators of a filter can form a resonator arrangement and, in one variant, can be acoustically coupled to one another, at least in part. The BAW resonators, each having a sufficient resonator surface area for the resonator arrangement's transmission characteristic to be linear, may be arranged one above another in a resonator stack. Such resonators can have a common electrode or can be coupled by an acoustically partially transmissive coupling layer or coupling layer system. FIG. 9 shows an acoustic coupling.

It is also possible for the specified resistor to have acoustically coupled SAW transducers, which may be arranged in an acoustic track between two reflectors. A DMS resonator filter with a DMS track or a multiport resonator are possibilities. However, the resonator can also be a single-port resonator having an acoustic track, which may be delimited by acoustic reflectors, with a transducer arranged between the reflectors.

Additionally, a method for evaluating linear properties of a resonator is specified. This method comprises the following steps:

A) Determining transmission characteristic curves of a resonator with a given resonator surface area, wherein output signal power versus input signal power is determined for the fundamental mode and an nth-order spectral component generated in the resonator, wherein n is an integer at least equal to 2, and the nth-order spectral component is selected from an nth-order harmonic and/or an nth-order intermodulation product.

B) Determining an intersection point of the linearly extrapolated linear ranges of the two transmission characteristic curves, and determining an actual critical input signal power of the resonator from this intersection point.

Instead of the resonator surface area, the layer thickness of the resonator's piezoelectric layer can be tested to evaluate linear properties of the resonator.

Step C) comprises the comparison of the actual critical input signal power level to a predetermined target level (minimum level). It is tested in step C) whether the target level of the input signal power was achieved, or by what amount the input signal power deviates from the target level. The further procedure depends on the result.

In the event of deviation of the actual critical input signal power from the predetermined target level, the resonator surface area is varied, i.e., increased in case of falling below the target level, or decreased in case this level is exceeded. Steps A) through C) are then repeated for the resonator with a correspondingly adapted value of the resonator surface area. If necessary, a series of resonators of the same type with mutually different values of the resonator surface area are tested as indicated above, wherein values of the actual critical input signal power are determined and may be plotted in a diagram of power versus surface area.

From this measurement series, the minimum value for the resonator surface area at which the actual critical input signal power of the resonator achieves the predetermined target level can be determined.

If the critical input signal power does not fall below a predetermined value, the resonator surface area is in principle sufficient. But particularly if the critical input signal power markedly exceeds the predetermined target level, it can be reduced for determining the minimum value for the resonator surface area, and steps A) through C) can be repeated for each value of the resonator surface area sufficiently often that the actual critical input signal power of the resonator at least reaches this target level or falls below it.

On the contrary, if the critical input signal power falls below the predetermined target level, the resonator surface area is iteratively increased, and steps A) to C) are then repeated for each iteration, i.e., for each value of the resonator surface area, sufficiently often that the actual critical input signal power of the resonator achieves at least this target level.

Instead of the actual critical input signal power, it is possible in an additional variant of the specified method to determine in step B) the actual critical output signal value $P_{OIPn}$ of the resonator, likewise corresponding to the intercept point, and to compare it to a predetermined target level for testing the linearity of the resonator.

The transmission characteristics of the resonator may be determined in the context of a simulation.

The transmission properties of a resonator can be determined in a dual-port measurement. For a single-port resonator, an input signal relative to signal ground is applied to a first terminal of the resonator. An output signal relative to signal ground can be read out at the second terminal of the resonator. The first terminal and signal ground form a first electrical port and the second terminal and signal ground form a second electrical port.

The resonator can be excited by a single-tone excitation. Alternatively, the resonator can be excited by a double-tone excitation as an input signal, wherein one component of the input signal may correspond to the resonant frequency of the resonator and an additional component of the input signal corresponds to an arbitrary other frequency. The other frequency can, for instance, be a multiple of the resonant frequency, particularly two or three times the resonant frequency.

A triple-beat test is also possible for the excitation of the resonator in the specified method.

The specified method can be performed to determine the minimum resonator surface area for at least one resonator of a filter or a duplexer. For example, the filter in the transmission circuit can be measured. The above-specified method may be used to evaluate each individual resonator of the filter or duplexer.

As a reference frequency to determine the minimum value of the resonator surface area it is possible to select the (series) resonant frequency of a resonator, and for a filter with a ladder-type arrangement of resonators, the series resonant frequency of a series resonator.

In place of transmission characteristic curves, characteristic curves of a signal reflected at the resonator—the fundamental mode as well as the harmonic or intermodulation signals—can be used to test linear properties of a resonator.

Additionally, a method for adjusting electrical properties of a resonator operating with bulk acoustic waves is specified, in which the critical input power $P_{IIPn}$ corresponding to an nth-order intercept point $IP_n$ is increased at a reduced thickness of the piezoelectric layer. In this case, materials of resonator electrodes are selected, for instance, with regard to density so that the predetermined resonant frequency of the resonator is achieved.

The specified resonator and a method for determining its minimum surface area will now be explained on the basis of schematic figures, not true to scale.

DETAILED DESCRIPTION

Figure 1:
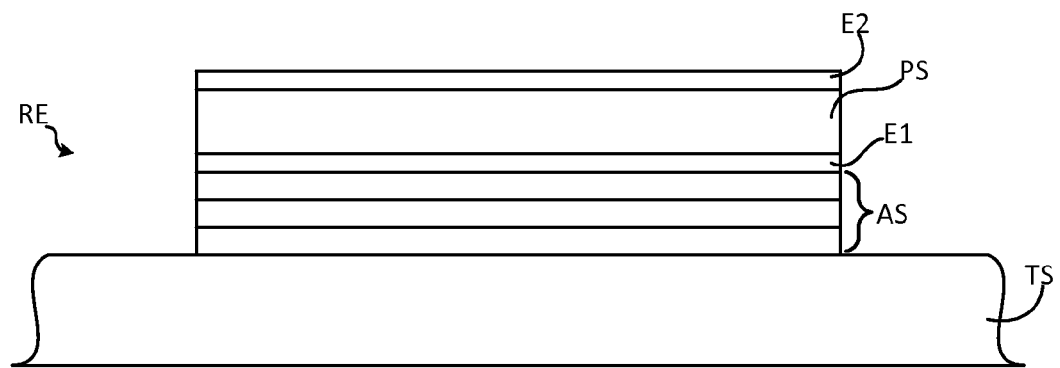
FIG. 1 shows a BAW resonator with an acoustic mirror (SMR type, SMR=solid mounted resonator)

FIG. 1 shows a thin film resonator RE with an acoustic mirror AS and a resonator area comprising two electrodes E1, E2 and a piezoelectric layer PS arranged therebetween. The piezoelectric layer can be made, for instance, of ZnO.

Resonator RE is arranged on a carrier substrate TS. Acoustic mirror AS is arranged between carrier substrate TS and the resonator area, and comprises layers with high and low acoustic impedance alternately stacked one above the other.

Figure 2:
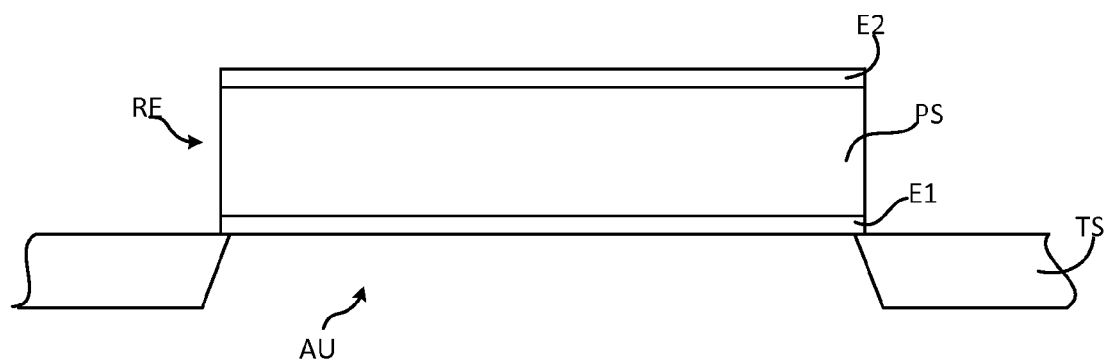
FIG. 2, a BAW resonator that is arranged above a cutout in the carrier substrate (bridge-type or membrane-type)

A bridge-like thin film resonator RE—a bridge-type/membrane-type BAW resonator—is shown in FIG. 2. The resonator is arranged here above a cutout AU formed in carrier substrate TS.

Electrodes E1, E2 in FIGS. 1, 2 include single conductive layer made, for instance, of AlCu. Each electrode, however, can include several sublayers that may have a high electrical and/or thermal conductivity. Piezoelectric layer PS can also have several sublayers instead of only one layer. The design of a thin film resonator is not restricted to the example shown in FIGS. 1 and 2.

In the determination of the transmission characteristic curves of a resonator, an input signal is applied to, for instance, first electrode E1, and an output signal is measured at the second electrode E2 of the resonator.

Figure 3:
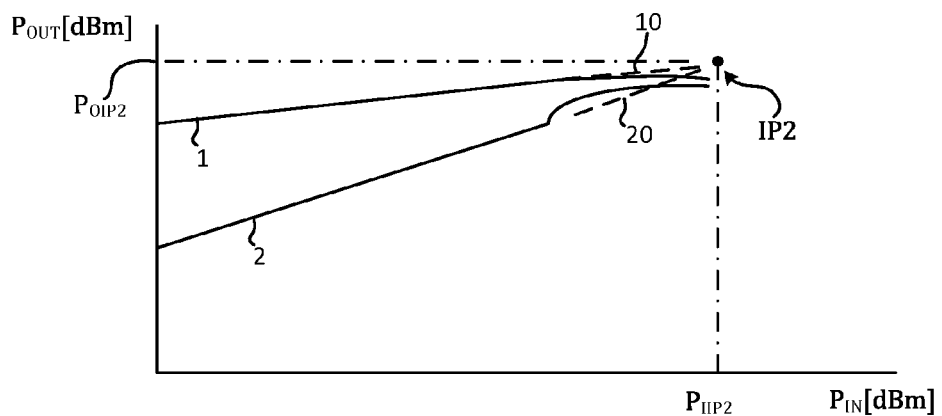
FIG. 3, a diagram for determining an input intercept point and an output intercept point of second order.

A diagram for determining an intercept point is shown in FIG. 3. The input signal power $P_{in}$ applied at the input of the resonators is plotted along the x-axis in dBm, and the output signal power $P_{out}$ measured at the output of the resonator is plotted along the y-axis in dBm. Transmission characteristic curve 1 of the fundamental mode as well as transmission characteristic curve 2 of the harmonic generated in the resonator at twice the frequency (i.e. the second-order harmonic) each have a linear section at low input signal levels. The frequency of the fundamental mode corresponds to the resonant frequency of the resonator.

It is indicated with dotted lines 10, 20 that linear sections of curves 1, 2 are linearly extended at least to their intersection point $IP_2$. From intersection point $IP_2$, a second-order input intercept point $P_{IIP2}$ and/or an output intercept point $P_{OIP2}$ are determined as the abscissa or the ordinate of intersection point $IP_2$.

In place of the transmission characteristic curve of the second harmonic generated in the resonator, an nth-order intermodulation product or an arbitrary additional nth-order harmonic, in particular the third harmonic, can be used to determine an nth-order intercept point $IP_n$.

On the basis of the position of an intercept point, linear properties of the resonator are tested, i.e., its (linear) dynamic range, in particular, the maximal input signal power at which the level difference between a useful signal and a noise signal is still sufficient for the linearity of the resonator's transmission characteristic.

The method for determining the minimum value of the resonator surface area is in principle the same for arbitrary intercept points. The actual nth-order intercept point is compared to a predetermined signal level, and the resonator surface area is optimized in relation to this signal level on the basis of the results. Each intercept point may correspond to an optimal signal level of its own.

Figure 4:
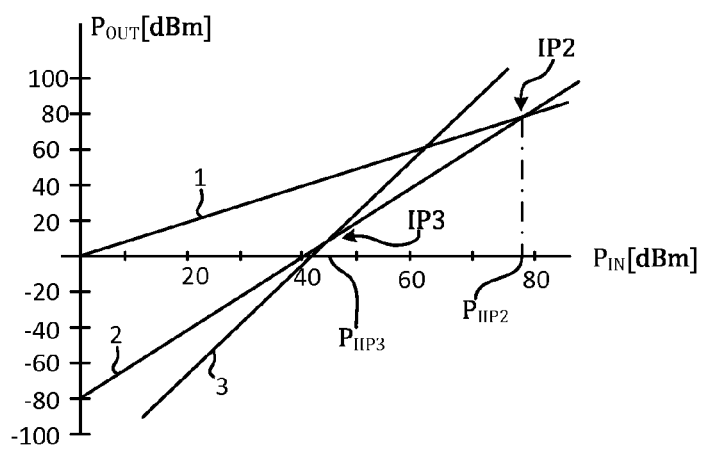
FIG. 4, transmission characteristic curves of the fundamental mode and the second and third-order harmonics for a resonator with a first resonator surface area.
Figure 5:
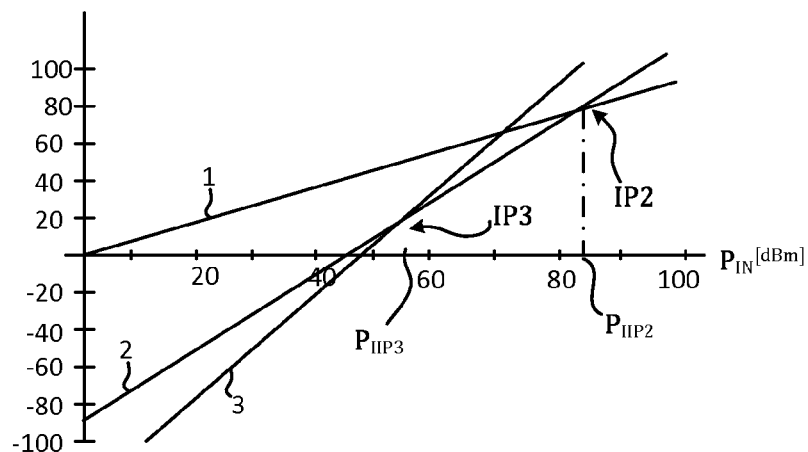
FIG. 5, transmission characteristic curves of the fundamental mode and the second and third-order harmonics for a resonator with a quadrupled resonator surface area.
Figure 6:
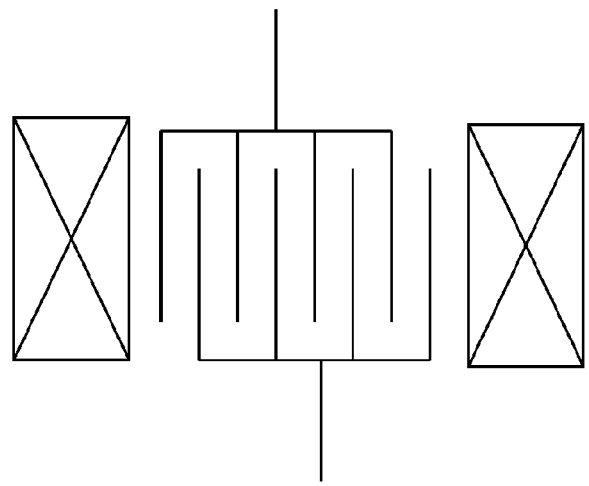
FIG. 6 shows a transverse plane of an SAW resonator.
Figure 7:
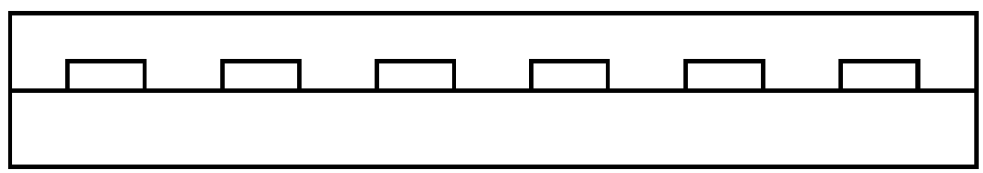
FIG. 7 shows a sagittal plane of a GBAW resonator.
Figure 8:
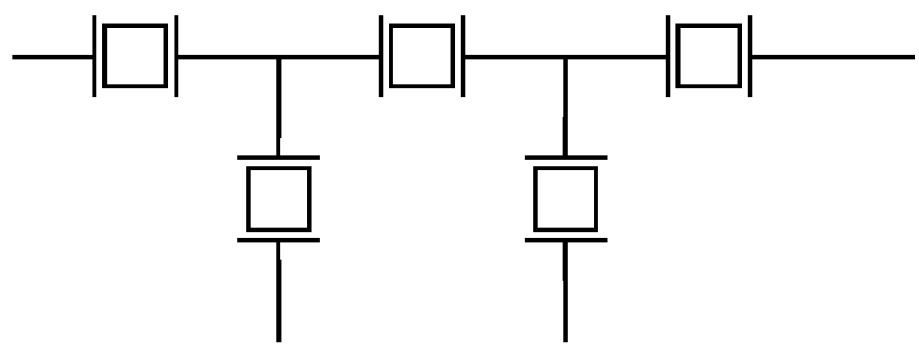
FIG. 8 shows a ladder-type filter circuit having series resonators in a series path and having a parallel resonator in each parallel branch.
Figure 9:
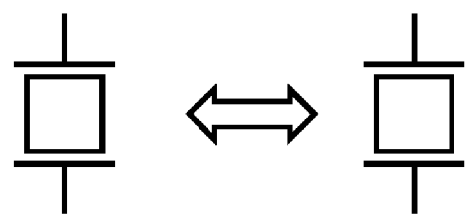
FIG. 9 shows acoustically coupled resonators.
Figure 10:
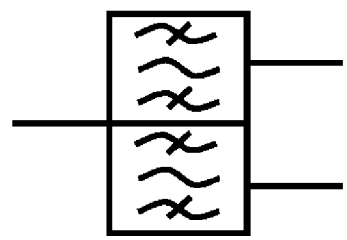
FIG. 10 shows bandpass filters electrically connected in a configuration that forms a duplexer.

FIG. 4 shows characteristic curves 1, 2, 3 for a resonator with a resonator surface area of 100×100 µm², and characteristic curves 1, 2, 3 for a resonator with a resonator surface area of 200×200 µm² are shown in FIG. 5. These characteristic curves were calculated for the respective resonator in a one-tone test. Curves 1 and 2 were already explained in the description for FIG. 3. Reference number 3 labels the transmission characteristic curve for the third-order harmonic generated in the resonator, at triple the resonant frequency of the resonator. $IP_3$ is the third-order intercept point, i.e., the intersection point of characteristic curve 1 of the fundamental mode and characteristic curve 3 of the third-order harmonic. $P_{IIP3}$ is the third-order input intercept point. $P_{IIP2}$ and $P_{IIP3}$ are also referred to as the second and third order critical input signal power.

From the diagram according to FIG. 4, $P_{IIP2}=74$ dBm and $P_{IIP3}=43$ dBm can be read out for the resonator with the smaller resonator surface area. For the resonator with the larger resonator surface area, the values $P_{IIP2}=85$ dBm and $P_{IIP3}=54$ dBm can be read out from the diagram according to FIG. 5.

One can recognize on the basis of FIGS. 4 and 5 that a fourfold increase of the resonant surface area leads to a significant increase of the values of the critical input signal power $P_{IIP2}$ and $P_{IIP3}$, and thus to an increase of a linear dynamic range of the resonator at higher input signal levels. This was demonstrated both in a simulation result and in a measurement.

The specified method is not limited to numerical simulations. In principle it is possible, for instance, to produce several resonators designed with the same resonant frequency, which may be arranged on the same carrier substrate, with different resonator surface areas, and to measure each of these resonators.

It is also provided that resonators having equal resonator surface areas but layer sequences that differ from one another can each be investigated with the specified method in order to determine an optimal layer sequence in relation to linear transmission properties.

In addition to the resonator surface area, the layer thickness of a piezoelectric layer can be used in the specified method for adjusting electrical resonator properties. This layer thickness determines the resonant frequency of a BAW resonator. By selecting the material of the electrodes, the thickness of the piezoelectric layer can be modified at an unchanged resonant frequency, since different electrode materials have mutually different densities. The electrode materials can be selected from, e.g., Al, AlCu, AlCuTi, Mo, TiW, W, Ru, Pt, Pd, Ta, Nb, Cr, V, Zr, Hf, Mn, Re, Au, Ag or combinations thereof.

What is claimed is:

1. An electroacoustic resonator comprising:
a resonator surface area configured so that a critical input signal power at an $n^{th}$-order intercept point $IP_n$ is at least 80 dBm for n=2 and/or at least 50 dBm for n=3.

2. The resonator of claim 1, further comprising:
an input port; and
an output port;
wherein the resonator is configured so that, when an input signal is applied to the input port, an output signal is generated at the output port that comprises a fundamental component at a resonant frequency $f_r$ of the resonator and an $n^{th}$-order spectral component generated by the resonator at a frequency differing from $f_r$;
wherein the $n^{th}$-order spectral component is an $n^{th}$-order harmonic or an $n^{th}$-order intermodulation product;
wherein the resonator has a transmission characteristic curve that characterizes an output signal power $P_{out}$ of the fundamental component as a function of an input signal power $P_{in}$;
wherein the resonator has an additional transmission characteristic curve that characterizes the output signal power $P_{out}$ of the $n^{th}$-order spectral component as a function of the input signal power $P_{in}$; and
wherein extended, linearly extrapolated linear sections of the transmission characteristic curve and the additional transmission characteristic curve intersect at the intercept point $IP_n$ at the critical input signal power.

3. The resonator of claim 1 or 2, wherein the critical input signal power is at least 90 dBm for n=2 and/or at least 60 dBm for n=3.

4. The resonator of claim 1 or 2, wherein the critical input signal power is at least 100 dBm for n=2 and/or at least 68 dBm for n=3.

5. The resonator of claim 1, wherein the resonator surface area is at least $K/f_r$, where $K=3.5 \cdot 10^4$ GHz·µm² and $f_r$ is a resonant frequency of the resonator expressed in GHz.

6. The resonator of claim 1, wherein the resonator surface area is at least $K/f_r$, where $K=6 \cdot 10^4$ GHz·µm² and $f_r$ is the a resonant frequency of the resonator expressed in GHz.

7. The resonator of claim 1, wherein the resonator surface area is at least $K/f_r$, where $K=10^5$ GHz·µm² and $f_r$ is he a resonant frequency of the resonator expressed in GHz.

8. An electroacoustic resonator comprising:
a resonator area for propagating an acoustic wave; and
a resonator surface area configured so that, when an input signal power of 0 dBm is applied at a resonant frequency $f_r$, power density in the resonator area does not exceed 40 dBm/m².

9. The resonator of claim 8, comprising:
an acoustic mirror;
electrodes; and
a piezoelectric layer arranged between the electrodes, the piezoelectric layer and the electrodes corresponding to the resonator area, the resonator area being above the acoustic mirror.

10. The resonator of claim 8, comprising:
electrodes;
a piezoelectric layer between the electrodes, the piezoelectric layer and the electrodes corresponding to the resonator area; and
a carrier substrate;
wherein the resonator area is above a cutout in the carrier substrate.

11. The resonator of claim 8, wherein the resonator surface area is at least $K/f_r$, where $K=3.5 \cdot 10^4$ GHz·µm² and $f_r$ is expressed in GHz.

12. The resonator of claim 8, wherein the resonator surface area is at least $K/f_r$, where $K=6\cdot10^4$ GHz·μm² and $f_r$ is expressed in GHz.

13. The resonator of claim 8, wherein the resonator surface area is at least $K/f_r$, where $K=10^5$ GHz·μm² and $f_r$ is expressed in GHz.

14. The resonator of claims 1 or 8, which comprises a thin-film resonator for operating with bulk waves.

15. The resonator of claims 1 or 8, which is for operating with surface acoustic waves.

16. The resonator claims 1 or 8, which is for operating with guided bulk acoustic waves.

17. The resonator of claims 1 or 8, which is in a series branch of a signal line.

18. The resonator of claims 1 or 8, which is in a shunt arm of a signal line.

19. A filter comprising plural electroacoustic resonators, each of the plural resonators comprising an electroacoustic resonator according to claim 1 or an electroacoustic resonator according to claim 8.

20. The filter of claim 19, wherein the plural resonators are connected in a ladder-type arrangement or a lattice-type arrangement.

21. The filter of claim 20, wherein the plural resonators are acoustically coupled to one another, at least in part.

22. The filter of claim 19, wherein the plural resonators are acoustically coupled to one another, at least in part.

23. A duplexer comprising:
a receive filter; and
a transmit filter;
wherein at least one of the transmit and receive filters comprises a filter according to claim 19.

24. An electroacoustic resonator comprising:
a resonator area for propagating an acoustic wave; and
a resonator surface area configured so that, when an input signal power of 0 dBm is applied at a resonant frequency $f_r$, power density in the resonator area does not exceed 55 dBm/m².

25. An electroacoustic resonator comprising:
a resonator area for propagating an acoustic wave; and
a resonator surface area configured so that, when an input signal power of 0 dBm is applied at a resonant frequency $f_r$, power density in the resonator area does not exceed 70 dBm/m².

26. A method comprising:
obtaining a signal at a resonator;
determining transmission characteristic curves of the resonator based on the obtained signal, the resonator having a resonator surface area for a fundamental mode and an $n^{th}$-order spectral component generated in the resonator, where n is a whole number of at least two and the $n^{th}$-order spectral component is selected from an $n^{th}$-order harmonic and/or an $n^{th}$-order intermodulation product, wherein, in the resonator, output signal power is determined as a function of input signal power;
determining an intersection point of linearly extrapolated linear ranges of the transmission characteristic curves;
determining an actual critical input signal power of the resonator based on the intersection point;
comparing the actual critical input signal power to a predetermined target level for a critical input signal power;
varying resonator surface area if there is a deviation of the actual critical input signal power from the predetermined target level;
determining values of the actual critical input signal power for a series of resonator surface areas obtained by the varying; and
determining a minimum value for the resonator surface area at which the actual critical input signal power of the resonator achieves the predetermined target level based on the values of the actual critical input signal power for the series of resonator surface areas.

27. The method of claim 26, wherein varying the resonator surface area comprises increasing the resonator surface area if the critical input signal power falls below the predetermined target level; and
wherein determining values of the actual critical input signal power for the series of resonator surface areas obtained by the varying comprises (a) determining additional transmission characteristic curves for the resonator with the resonator surface increased and (b) determining an intersection point of linearly extrapolated linear ranges of the additional transmission characteristic curves.

28. The method of claim 26, wherein the resonator surface area is sufficient if the actual critical input signal power does not fall below a predetermined value.

29. A method comprising:
obtaining a signal at a resonator;
determining transmission characteristic curves of the resonator based on the obtained signal, the resonator having a resonator surface area for a fundamental mode and an $n^{th}$-order spectral component generated in the resonator, where n is a whole number of at least two and the $n^{th}$-order spectral component is selected from an $n^{th}$-order harmonic and/or an $n^{th}$-order intermodulation product, wherein output signal power of the resonator is determined as a function of input signal power of the resonator;
determining an intersection point of linearly extrapolated linear ranges of the transmission characteristic curves;
determining an actual critical output signal power of the resonator based on the intersection point;
comparing the actual critical output signal power to a predetermined target level for a critical output signal power;
varying the resonator surface area if there is a deviation of the actual critical output signal power from the predetermined target level;
determining values of the actual critical output signal power for a series of resonator surface areas obtained by the varying; and
determining a minimum value for the resonator surface area at which the actual critical input signal power of the resonator achieves the predetermined target level based on the values of the actual critical output signal power for the series of resonator surface areas.

30. The method of claim 29, which is performed to determine minimum resonator surface area, wherein the resonator is part of a filter.

31. The method of claim 29, which is performed to determine minimum resonator surface area, wherein the resonator is part of a duplexer.

32. A method performed using a resonator that is a bulk acoustic wave resonator, the method comprising:
obtaining a signal at the resonator;
determining transmission characteristic curves of the resonator based on the obtained signal, the resonator having a layer of thickness of a piezoelectric layer for a fundamental mode and an $n^{th}$-order spectral component generated in the resonator, where n is a whole number of at least two and the $n^{th}$-order spectral component is selected from an $n^{th}$-order harmonic and/or an $n^{th}$-order intermodulation product, wherein output signal power of the resonator is determined versus input signal power of the resonator;

determining an intersection point of linearly extrapolated linear ranges of the transmission characteristic curves;

determining an actual critical input signal power of the resonator corresponding to the intersection point;

comparing the actual critical input signal power to a predetermined target level for a critical input signal power;

varying the layer thickness of the piezoelectric layer if there is a deviation of the actual critical input signal power from the predetermined target level;

determining values of the actual critical input signal power for a series of resonator thicknesses based on the varying; and determining a minimum value for the layer thickness at which the actual critical input signal power of the resonator achieves the predetermined target level based on values of the actual critical input signal power for a series of resonator thicknesses.

33. The method of claim 32, wherein varying the layer thickness comprises increasing the layer thickness if the critical input signal power falls below the predetermined target level; and wherein determining values of the actual critical input signal power for the series of resonator surface thicknesses obtained by the varying comprises (a) determining additional transmission characteristic curves for the resonator with the layer thickness increased and (b) determining an intersection point of linearly extrapolated linear ranges of the additional transmission characteristic curves.

34. The method according of claim 32, further comprising:

selecting materials for electrodes of the resonator to compensate for an effect of changing the layer thickness of the piezoelectric layer on the resonant frequency of the resonator.

35. The method of claim 34, wherein the materials are selected from the group consisting of: Al, AlCu, AlCuTi, Mo, Ti—W, W, Ru, Pt, Pd, Ta, Nb, Cr, V, Zr, Hf, Mn, Re, Au, Ag.

36. The method of claims 26, 29 or 32, wherein transmission characteristic curves of the resonator are determined by simulation.

37. The method of claims 26, 29 or 32, wherein the resonator is excited via a one-tone excitation input signal.

38. The method of claims 26, 29 or 32, wherein the resonator is excited via a two-tone excitation input signal.

39. A method for adjusting electrical properties of a resonator operating with bulk acoustic waves, the method comprising:

reducing a layer thickness of a piezoelectric layer of the resonator;

selecting a material for at least one electrode of the resonator that has a density that increases a critical input power of the resonator corresponding to an $n^{th}$-order intercept point.

\* \* \* \* \*

UNITED STATES PATENT AND TRADEMARK OFFICE
CERTIFICATE OF CORRECTION

PATENT NO. : 8,076,999 B2
APPLICATION NO. : 11/917417
DATED : December 13, 2011
INVENTOR(S) : Schmidhammer Page 1 of 2

It is certified that error appears in the above-identified patent and that said Letters Patent is hereby corrected as shown below:

Title Page, Column 2 (Abstract), Line 8:
delete "80 dBm" and insert -- 50 dBm --, therefor.

Column 8, Line 33, Claim 4:
delete "68" and insert -- 65 --, therefor.

Column 8, Line 39, Claim 6:
delete "GHz$_{\mu m}^{2}$" and insert -- GHz $\mu m^2$ --, therefor.

Column 8, Line 39, Claim 6:
delete "is the a" and insert -- is a --, therefor.

Column 8, Line 42, Claim 7:
delete "is he a" and insert -- is a --, therefor.

Column 9, Line 7, Claim 14:
delete "claims" and insert -- claim --, therefor.

Column 9, Line 9, Claim 15:
delete "claims" and insert -- claim --, therefor.

Column 9, Line 11, Claim 16:
delete "resonator claims" and insert -- resonator of claim --, therefor.

Column 9, Line 13, Claim 17:
delete "claims" and insert -- claim --, therefor.

Column 9, Line 15, Claim 18:
delete "claims" and insert -- claim --, therefor.

Signed and Sealed this
Twenty-eighth Day of February, 2012

David J. Kappos
*Director of the United States Patent and Trademark Office*

CERTIFICATE OF CORRECTION (continued)
U.S. Pat. No. 8,076,999 B2

Column 10, Line 63, Claim 32:
after "a layer", delete "of".

Column 12, Line 4, Claim 34:
delete "of" and insert -- to --, therefor.

Column 12, Line 13, Claim 36:
delete "claims" and insert -- claim --, therefor.

Column 12, Line 16, Claim 37:
delete "claims" and insert -- claim --, therefor.

Column 12, Line 18, Claim 38:
delete "claims" and insert -- claim --, therefor.